US006665353B1

(12) United States Patent
Nisbet

(10) Patent No.: US 6,665,353 B1
(45) Date of Patent: Dec. 16, 2003

(54) QUADRANT SWITCHING METHOD FOR PHASE SHIFTER

(75) Inventor: John J. Nisbet, Nepean (CA)

(73) Assignee: Sirenza Microdevices, Inc., Sunnyvale, CA (US)

( * ) Notice: Subject to any disclaimer, the term of this patent is extended or adjusted under 35 U.S.C. 154(b) by 8 days.

(21) Appl. No.: 10/023,785

(22) Filed: Dec. 18, 2001

(51) Int. Cl.[7] ............................................. H04L 27/20
(52) U.S. Cl. ...................... 375/302; 332/144; 327/234; 327/235; 327/238
(58) Field of Search ................................ 375/261, 295, 375/296, 298, 302; 327/231, 233, 234, 235, 237, 238, 248; 332/144

(56) References Cited

U.S. PATENT DOCUMENTS

| 4,977,382 A | * 12/1990 | Podell et al. | ............... 333/164 |
| 5,019,793 A | * 5/1991 | McNab | ........................ 333/156 |
| 5,541,961 A | * 7/1996 | Farrow | ........................ 375/371 |
| 6,144,704 A | * 11/2000 | Startup et al. | ............... 375/260 |

2002/0018534 A1 * 2/2002 Sevenhans et al. ......... 375/354

OTHER PUBLICATIONS

"A Monolithic Microsystem for Analog Synthesis of Trigonometric Functions and Their Inverses", By Barrie Gilbert, IEEE Journal of Solid–State Circuits, vol. SC–17, No. 6, Dec. 1982, pp. 1179–1191.

* cited by examiner

*Primary Examiner*—Amanda T. Le
(74) *Attorney, Agent, or Firm*—Christopher P. Maiorana, P.C.

(57) ABSTRACT

An apparatus comprising a quadrature network, an RF combining circuit and a weighting network. The quadrature network may be configured to generate a first and a second signal in response to an input signal. The RF combining circuit may be configured to generate an output signal comprising the input signal variably phase shifted from a selectable fixed phase starting point in response to the first signal, the second signal and one or more weighting signals. The weighting network may be configured to generate the weighting signals in response to a voltage control signal and one of four possible output selections. The voltage control signal may be configured to control the variable phase shift.

23 Claims, 10 Drawing Sheets

QUADRANT SWITCHING METHOD FOR PHASE SHIFTER

FIELD OF THE INVENTION

The present invention relates to a method and/or architecture for implementing phase shifters generally and, more particularly, to a method and/or architecture for implementing a phase shifter with 180 degrees of phase adjustment from one of four fixed phase positions which may be selectable by a user.

BACKGROUND OF THE INVENTION

Referring to FIG. 1, a phase tuning representation 10 of a conventional 180 degree phase shifter is shown. Phase shifters are frequently used in RF signal processing (e.g., power amplifier correction, antenna beam forming, diversity signal combining, etc.). A typical phase shifter provides a phase shift adjustment range of 180 degrees for a given range of electronic control input. An input signal VPHS is varied to control the phase shift (i.e., VPHS varies from 0V to +5V). For example, the phase shifter continuously adjusts transfer phase from −90 degrees at VPHS=0V to +90 degrees at VPHS=+5V. When a particular desired transfer phase lies outside the range (i.e., +120 degrees), additional fixed or variable phase shift must be added at additional cost, space and complexity. Adding fixed phase shift limits flexibility, since the fixed phase shift chosen will still only provide 180 degrees to be tuned electronically.

Conventional approaches can add a variable mechanical phase shift. However, such mechanical phase shifters are expensive, bulky and delicate. Conventional approaches can also cascade two 180 degree phase shifters. However, such a configuration doubles the value of the phase tuning constant, which can cause unacceptable tuning noise, loop dynamic issues, and/or noise figure degradation.

Referring to FIG. 2, a conventional 180 degree phase shifter 20 is shown. The RF input signal RF_IN is split in a quadrature network 22. The outputs COS(R) and SIN(R) are equal in magnitude and 90 degrees apart in phase. The RF signals SIN(R) and COS(R) are applied to two four-quadrant analog multipliers 24 and 26. The multipliers 24 and 26 are controlled by two baseband signals A and B. The RF outputs from the multipliers 24 and 26 are summed by the summing amplifier 28 to produce a composite RF output signal RF_OUT. The signals A and B are derived from the VPHS input using the weighting network 30. The weighting functions A=f1(VPHS) and B=f2 (VPHS) are designed such that the magnitude of the RF transfer function remains constant as VPHS is tuned, while the phase of the RF transfer function of the circuit 20 varies linearly with VPHS. The circuit 20 has an RF transfer function as shown in FIG. 1.

It is generally desirable to have a phase shifter that may (i) provide a variable phase shift adjustment from a selected fixed starting point (e.g., a variable phase shift of ±90 degrees from +90 degrees which is from 0 to 180 degrees), (ii) be implemented using a minimum of die area, (iii) provide low cost implementation, and/or (iv) provide robust operation.

SUMMARY OF THE INVENTION

The present invention concerns an apparatus comprising a quadrature network, an RF combining circuit and a weighting network. The quadrature network may be configured to generate a first and a second signal in response to an input signal. The RF combining circuit may be configured to generate an output signal comprising the input signal variably phase shifted from a selectable fixed phase starting point in response to the first signal, the second signal and one or more weighting signals. The weighting network may be configured to generate the weighting signals in response to a voltage control signal and one of four possible output selections. The voltage control signal may be configured to control the variable phase shift.

The objects, features and advantages of the present invention include providing a method and/or architecture for implementing a phase shifter with 180 degrees of phase adjustment from one of four fixed phase positions that may (i) provide user selectability, (ii) provide a variable phase shift adjustment from a selectable, fixed starting point, (iii) be implemented in minimal die area, (iv) be implemented with a lower cost and have a more robust operation than mechanical designs, and/or (v) reduce or eliminate tuning noise, loop dynamic issues and noise figure degradations.

BRIEF DESCRIPTION OF THE DRAWINGS

These and other objects, features and advantages of the present invention will be apparent from the following detailed description and the appended claims and drawings in which:

FIG. 6 is a detailed block diagram of the RF combining circuit of FIG. 5a;

DETAILED DESCRIPTION OF THE PREFERRED EMBODIMENTS

Typical phase shifters implement a continuously adjustable phase shift range of 180 degrees from a single fixed position in response to a continuous control variable signal. The present invention may implement a phase shifter with 180 degrees of phase adjustment from any one of four fixed phase positions. The fixed positions may be selectable by a user or other external source.

Figure 1:
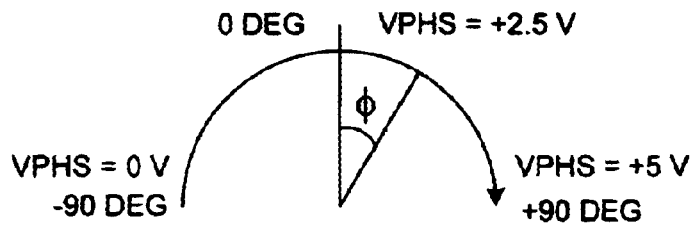
FIG. 1 is a phase tuning representation of a conventional 180 degree phase shifter.
Figure 2:
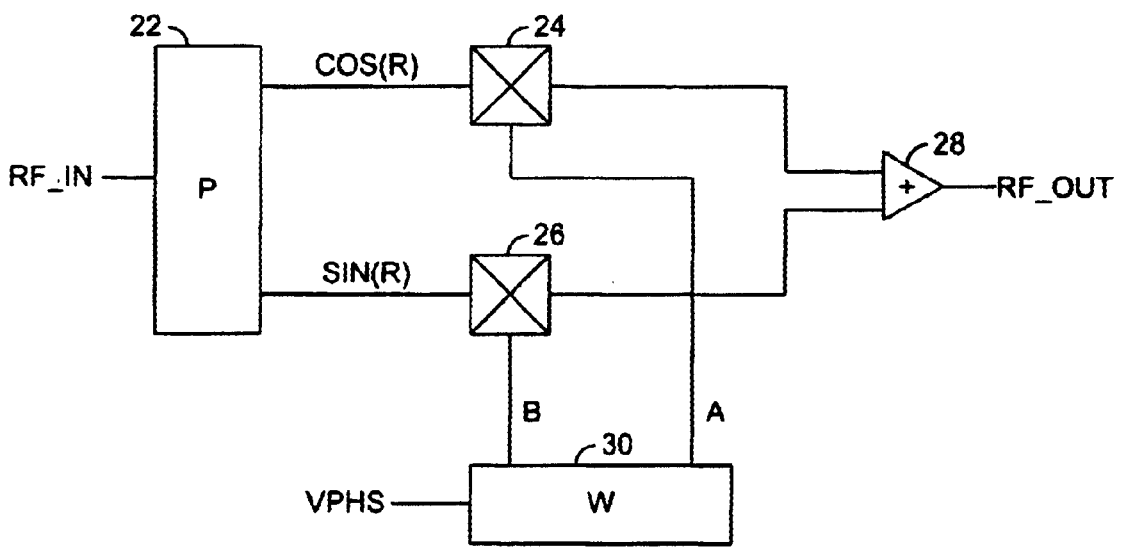
FIG. 2 is a block diagram of a conventional 180 degree phase shifter.
Figure 3:
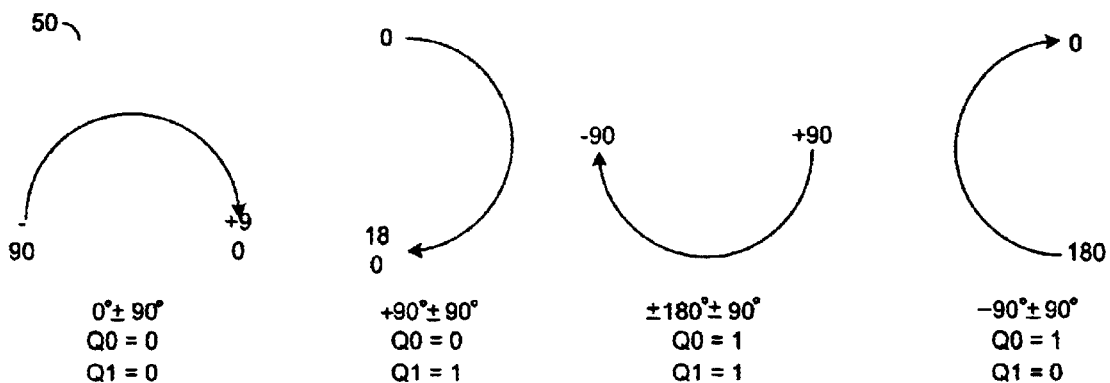
FIG. 3 is a phase tuning representation of a four-quadrant 180 degree phase shifter.

Referring to FIG. 3, a phase tuning representation 50 of a four-quadrant 180 degree phase shifter is shown. Selection of one of the four fixed phases is implemented using two digital control bits (e.g., Q0 and Q1). The 180 degree phase shifter may be configured to provide 180 degrees of tuning range around each of four fixed phase shifts corresponding to 0 degrees, +90 degrees, −90 degrees and ±180 degrees in response to the selection control signal bits Q0 and Q1. Variable phase shift adjustment may be implemented using an input control signal (e.g., VPHS).

Figure 4:
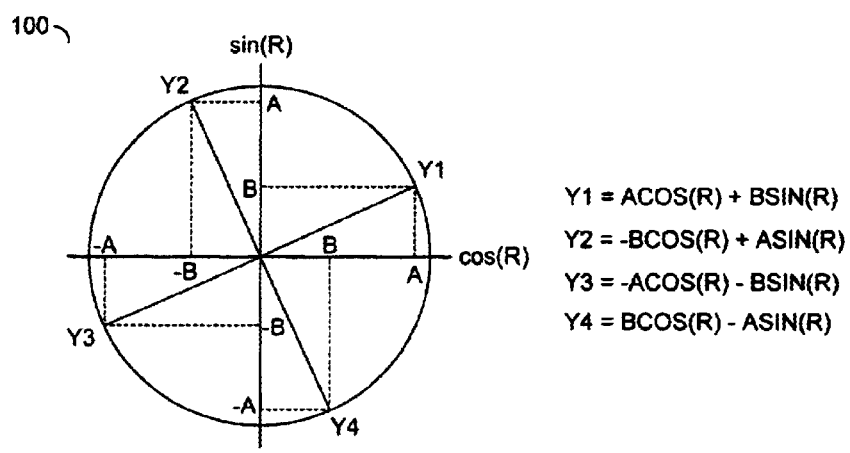
FIG. 4 is a diagram illustrating an operation of the present invention.

Referring to FIG. 4, an operation diagram 100 illustrating generation of four quadrant phase shifts using RF quadrature signals is shown in accordance with a preferred embodiment of the present invention. Operation quadrature RF components (e.g., COS(R) and SIN(R)) may be weighted and summed to produce a number of desired outputs (e.g., Y1, Y2, Y3 and Y4).

The outputs Y1, Y2, Y3 and Y4 may correspond to the quadrants. In particular, the outputs Y1, Y2, Y3 and Y4 may be defined as follows:

$$Y1 = A*COS(R) + B*SIN(R)$$

$$Y2 = -B*COS(R) + A*SIN(R)$$

$$Y3 = -A*COS(R) + -B*SIN(R)$$

$$Y4 = B*COS(R) + -A*SIN(R)$$

The coefficients A and B may be implemented as weighted amplitudes (to be discussed in connection with FIGS. 5–7). The diagram 100 illustrates a method for implementing variable phase shift adjustment (e.g., a range of 180 degrees) centered at a selectable fixed starting point (e.g., 0–360 degrees).

Figure 5A:
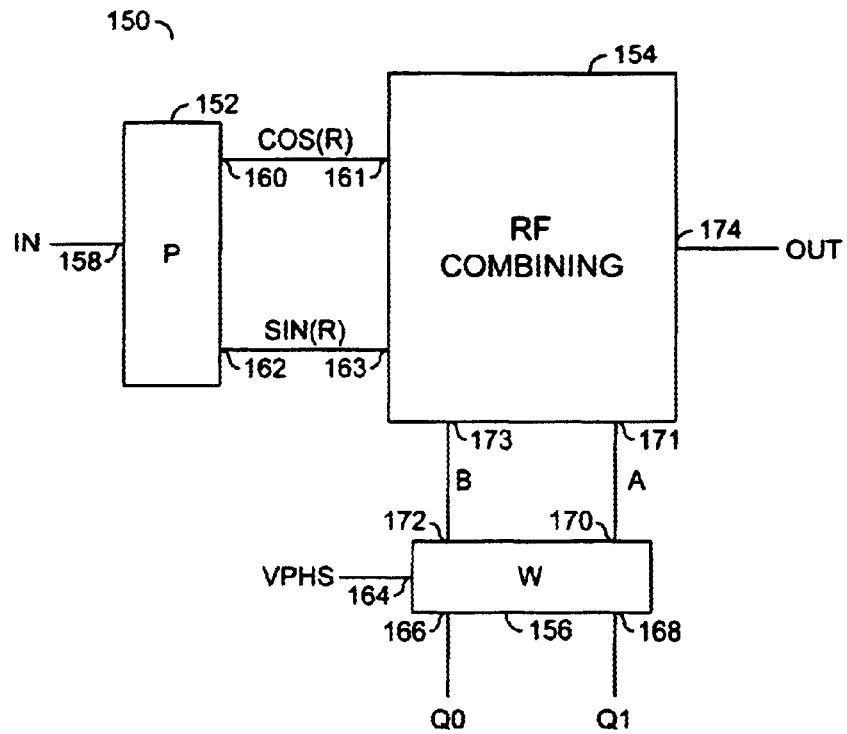
FIGS. 5(a–b) are block diagrams of preferred embodiments of the present invention.

Referring to FIG. 5a, a four-quadrant 180 degree phase shifter circuit 150 is shown. The circuit 150 generally comprises a quadrature network block (or circuit) 152 an RF combining block (or circuit) 154 and a weighting network block (or circuit) 156. The quadrature network 152 may have an input 158 that may receive a signal (e.g., IN). The signal IN may be an RF input signal. The quadrature network 152 may also have an output 160 that may present the signal COS(R) to an input 161 of the RF combining circuit 154 and an output 162 that may present the signal SIN(R) to an input 163 of the RF combining circuit 154. The circuit 152 may be configured to generate the signals COS(R) and SIN(R) in response to the signal IN.

The weighting network 156 may have an input 164 that may receive a signal (e.g., VPHS), an input 166 that may receive a signal (e.g., Q0), an input 168 that may receive a signal (e.g., Q1), an output 170 that may present the signal A to an input 171 of the RF combining circuit 154 and an output 172 that may present the signal B to an input 173 of the RF combining circuit 154. The RF combining circuit 154 may also have an output 174 that may present an output signal (e.g., OUT). The circuit 154 may be configured to generate the signal OUT in response to the signals COS(R), SIN(R), A and B. The signal VPHS may be implemented as a voltage controlled phase shift control signal (e.g., a variable phase shift control signal). The signals Q0 and Q1 may be implemented as select signals configured to select a desired quadrant (e.g., a fixed phase starting point). The signals A and B may be implemented as baseband weighted amplitude control signals. The signal OUT may be implemented as an RF phase-shifted output signal. The signal OUT is generally variably phase-shifted from a selectable fixed phase starting point of the signal IN.

The circuit 156 may be configured to generate the signals A and B in response to the signals VPHS, Q0 and Q1. The circuit 150 may be configured to generate the signal OUT in response to the signals IN, VPHS, Q0 and Q1. The circuit 150 generally minimizes capacitive loading on the RF signals COS(R) and SIN(R). The signals IN, VPHS, OUT, COS(R), SIN(R), A, and B may be implemented as differential signals. For example, the signals IN, VPHS, OUT, COS(R), SIN(R), A, and B are generally presented as either a positive polarity signal (e.g., IN_P, VPHS_P, etc.) and/or as a negative polarity signal (e.g., IN_N, VPHS_N, etc.), where the positive and negative signals are equal in magnitude and opposite phase (e.g., ±180 degrees offset).

The baseband weights A and B of the circuit 150 may be switched in response to the signals Q0 and Q1. The signals Q0 and Q1 may be implemented to switch to the quadrants Y1–Y4 as shown in the following TABLE 1:

TABLE 1

| Q0 | Q1 | quadrant | COS(R) | SIN(R) |
| --- | --- | --- | --- | --- |
| 0 | 0 | Y1 | A | B |
| 0 | 1 | Y2 | −B | A |
| 1 | 1 | Y3 | −A | −B |
| 1 | 0 | Y4 | B | −A |

Figure 5B:
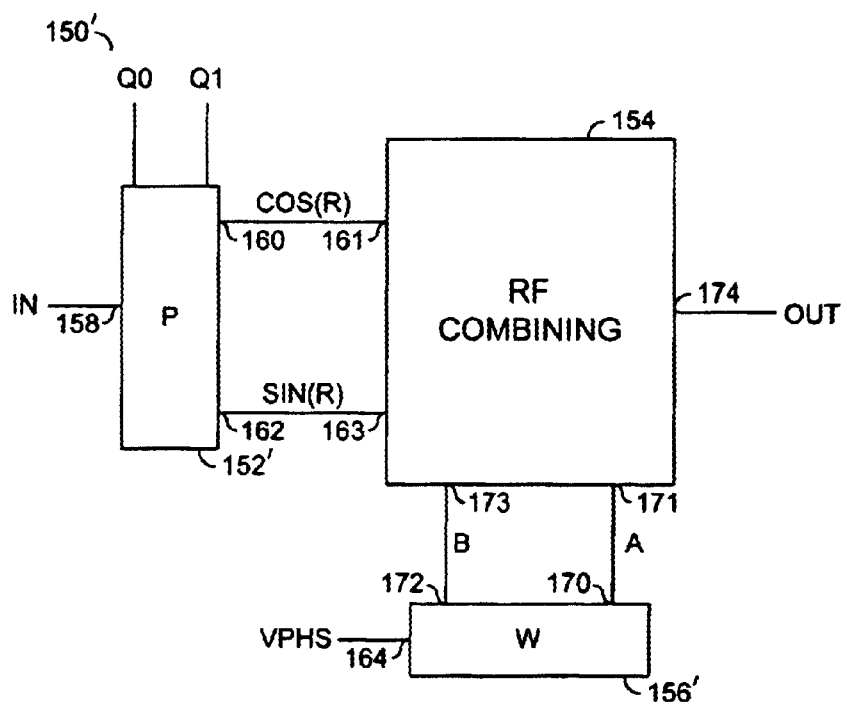

Referring to FIG. 5b, an alternate configuration 150' of the four-quadrant 180 degree phase shifter circuit 150 is shown. The circuit 150' generally comprises a quadrature network 152', the circuit 154 and a weighting network 156'. The quadrature network 152' may be configured to receive the select signals Q0 and Q1. The circuit 152' may be configured to generate the signals COS(R) and SIN(R) in response to the signals IN, Q0 and Q1. The circuit 156' may be configured to generate the signals A and B in response to the signal VPHS. The RF components COS(R) and SIN(R) of the circuit 150' may be switched in response to the signals Q0 and Q1. The signals Q0 and Q1 may be configured to switch to the quadrants Y1–Y4 shown in TABLE 2:

TABLE 2

| Q0 | Q1 | quadrant | A | B |
| --- | --- | --- | --- | --- |
| 0 | 0 | Y1 | COS(R) | SIN(R) |
| 0 | 1 | Y2 | SIN(R) | −COS(R) |
| 1 | 1 | Y3 | −COS(R) | −SIN(R) |
| 1 | 0 | Y4 | −SIN(R) | COS(R) |

Figure 6:
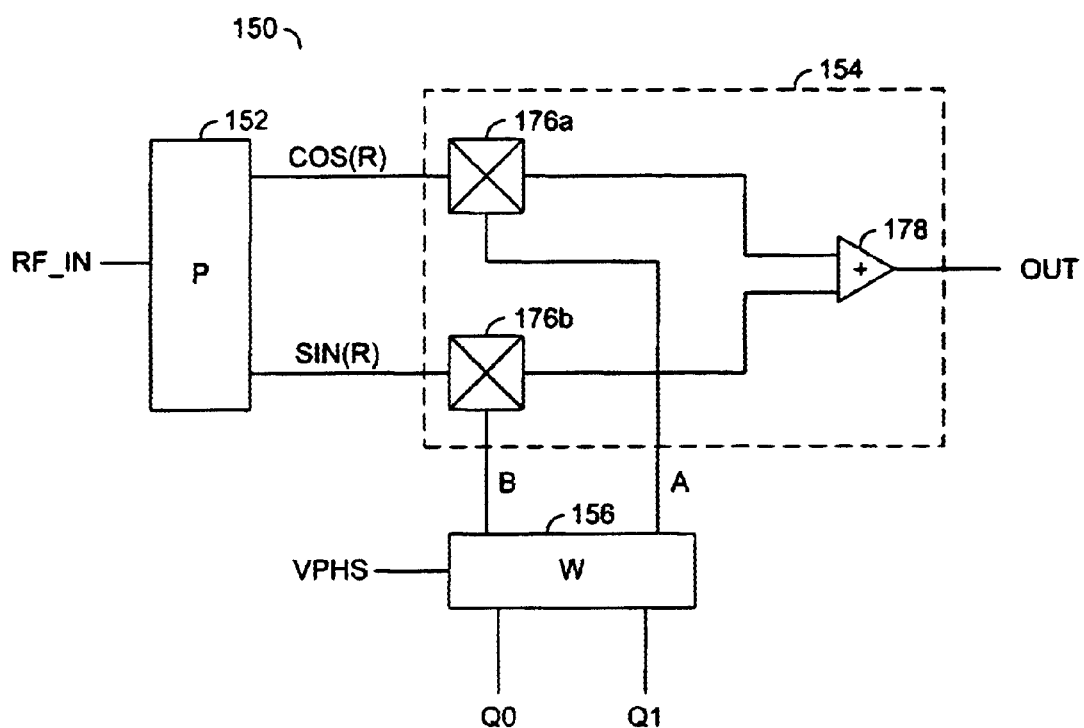

Referring to FIG. 6, the RF combining circuit 154 is shown comprising a number of multipliers 176a–176n and an amplifier 178. The multiplier 176a may have a first input that may receive the signal COS(R) and a second input that may receive the amplitude signal A. The multiplier 176a may also present an output to the amplifier 178. The multiplier 176n may have a first input that may receive the signal SIN(R) and a second input that may receive the amplitude signal B. The multiplier 176n may also present a signal to the amplifier 178. The amplifier 178 may be implemented as a summing amplifier. The summing amplifier 178 may generate the signal OUT in response to the outputs of the multipliers 176a–176n In both of the circuits 150 and 150' switching of the four quadrants Y1–Y4 may depend on (i) the circuitry configured to generate both positive polarity and negative polarity weighted signals from an input signal (e.g., the generation of the signals A_P, A_N, B_P and B_N) and (ii) the circuitry configured to route an input signal to one of two possible outputs (e.g., routing the signal VPHS selectively to the outputs A and B).

Figure 7:
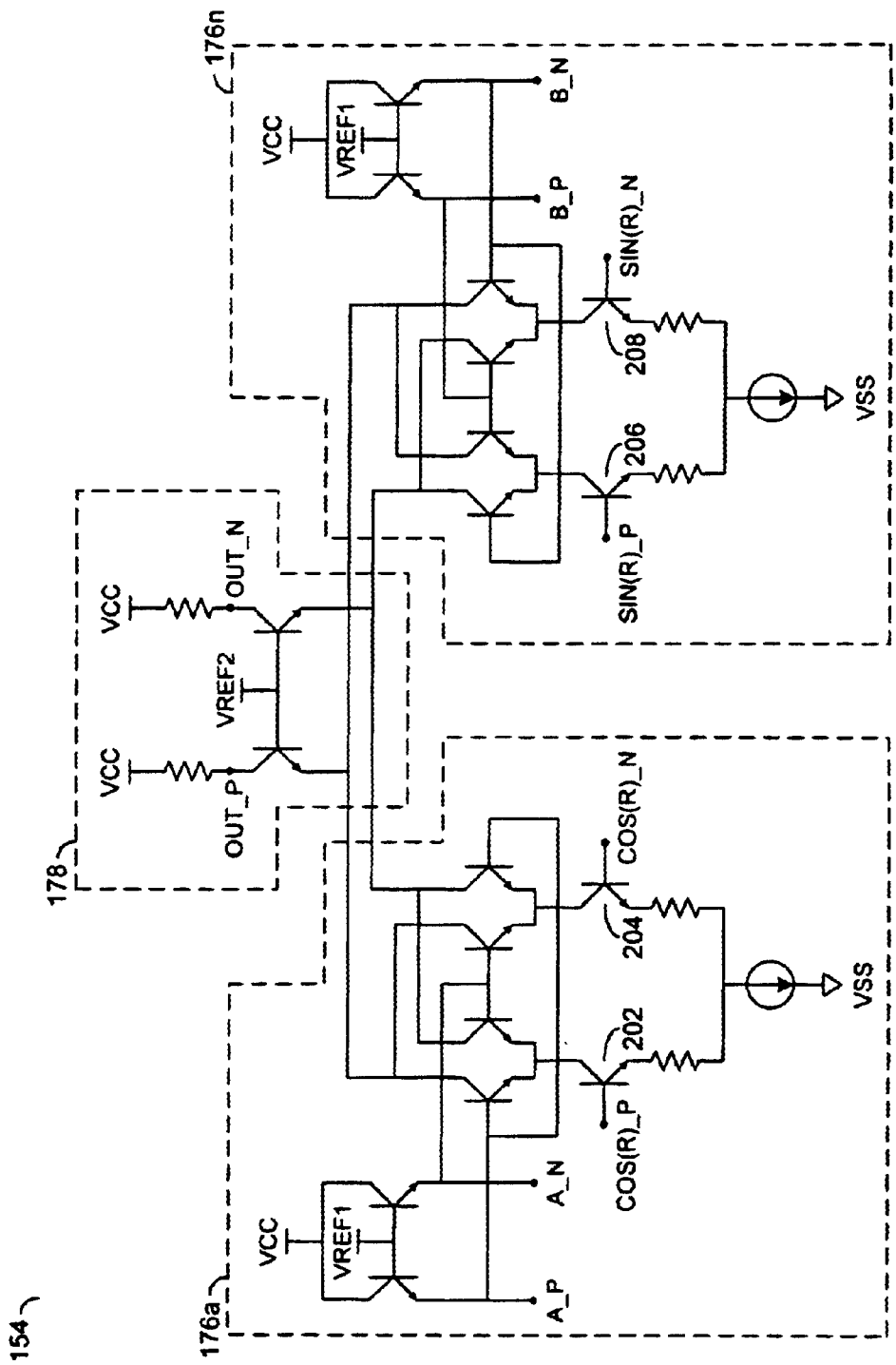
FIG. 7 is a more detailed diagram of the RF combining circuit of FIGS. 5a and 6.

Referring to FIG. 7, the signal path multiply-and-sum function corresponding to the multipliers 176a–176n and the summing amplifier 178 of the logic circuit 154 is shown. The RF inputs COS(R) and SIN(R) may be generated by the quadrature network 152 as voltages. An input differential pair 202 and 204 and an input differential pair 206 and 208 may convert the voltages COS(R) and SIN(R) to currents that may then be multiplied by the differential weighting currents A and B, respectively. The differential common-base amplifier 178 may be configured to sum the output currents at a low impedance such that wide bandwidth is maintained.

Figure 8:
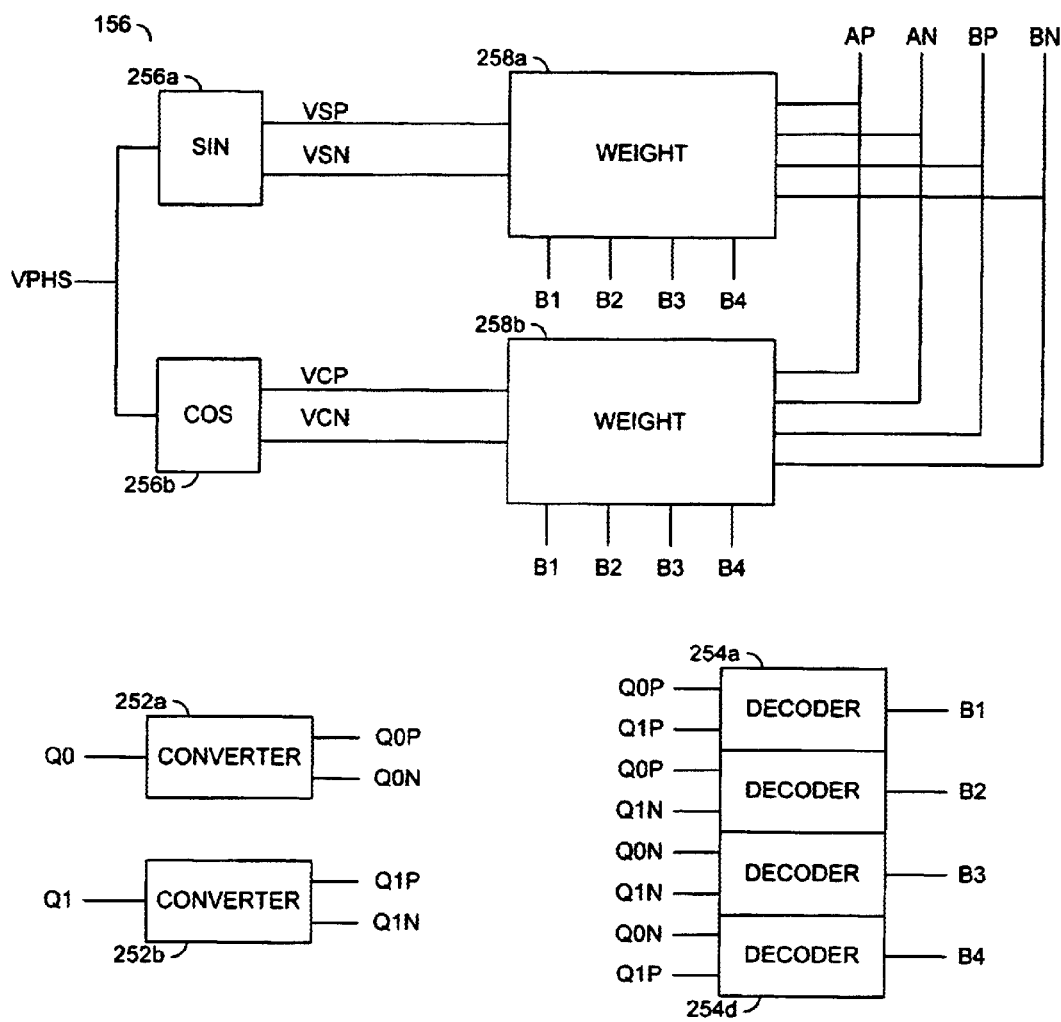
FIG. 8 is a block diagram of the weighting network of FIGS. 5a and 6.

Referring to FIG. 8, the circuit 156 is shown comprising a number of converter blocks (or circuits) 252a–252b, a number of decoder blocks (or circuits) 254a–254d, a number of generator blocks (or circuits) 256a–256b and a number of weight blocks (or circuits) 258a–258b. The converter 252a may receive the signal Q0 and present a signal (e.g., Q0P) and a signal (e.g., Q0N). The converter 252a may be configured to generate the signals Q0P and Q0N in response to the signal Q0. The converter 252b may receive the signal Q1 and present a signal (e.g., Q1P) and a signal (e.g., Q1N). The converter 252b may be configured to generate the signals Q1P and Q1N in response to the signal Q1. The signals Q0P, Q0N, Q1P, and Q1N may be implemented as low-level logic switch signals.

The decoder 254a may receive the signals Q0P and Q1P and present a signal (e.g., B1). The decoder 254a may be configured to generate the signal B1 in response to the signals Q0P and Q1P. The decoder 254b may receive the signals Q0P and Q1N and present a signal (e.g., B2). The decoder 254b may be configured to generate the signal B2 in response to the signals Q0P and Q1N. The decoder 254c may receive the signals Q0N and Q1N and present a signal (e.g., B3). The decoder 254c may be configured to generate the signal B3 in response to the signals Q0N and Q1N. The decoder 254d may receive the signals Q0N and Q1P and present a signal (e.g., B4). The decoder 254d may be configured to generate the signal B4 in response to the signals Q0N and Q1P. The signals B1, B2, B3 and B4 may be implemented as current bias points.

The generators 256a–256b may receive the voltage control phase signal VPHS. The generator 256a may present a number of signals (e.g., VSP and VSN). The generator 256b may present a number of signals (e.g., VCP and VCN). The signals VSP, VSN, VCP and VCN may be implemented as sine and cosine differential voltages. The generators 256a–256b may be configured to generate the signals VSP, VSN, VCP and VCN in response to the signal VPHS.

The weight circuit 258a may receive the signals VSP, VSN, B1, B2, B3 and B4. The weight circuit 258a may also present the signals AP, AN, BP and BN. The converter 258a may be configured to generate the signals AP, AN, BP and BN in response to the signals VSP, VSN and B1–B4. The weight circuit 258b may receive the signals VSP, VCN, B1, B2, B3 and B4. The converter 258b may also present the signals AP, AN, BP and BN. The converter 258b may be configured to generate the signals AP, AN, BP and BN in response to the signals VCP, VCN and B1–B4.

Figure 9:
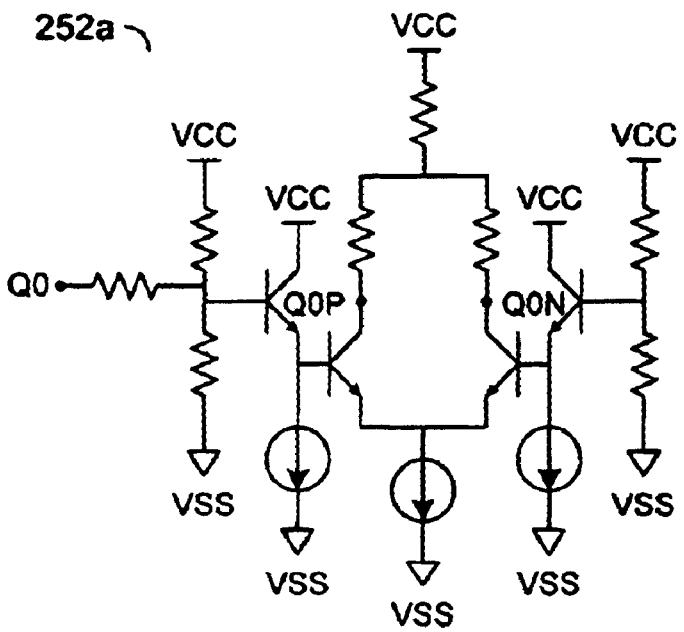
FIG. 9 is a more detailed diagram of the conversion circuits of FIG. 8.
Figure 9:
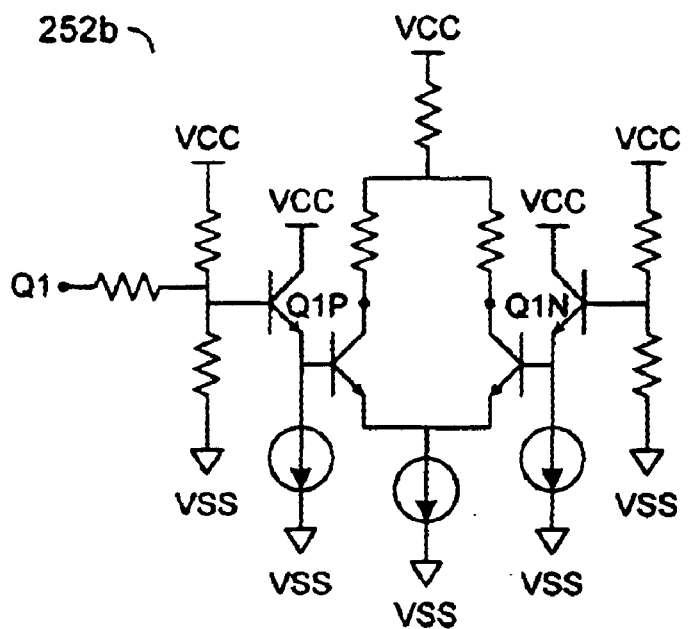

Referring to FIG. 9, detailed diagrams of the converters 252a–252b are shown. The converters 252a–252b may be configured to convert the signal Q0 and the signal Q1 CMOS inputs to the complementary low-level logic signals Q0N, Q0P, Q1N, and Q1P. The converter 252a may be configured to convert the input Q0. The converter 252b may be configured to convert the input Q1.

Figure 10:
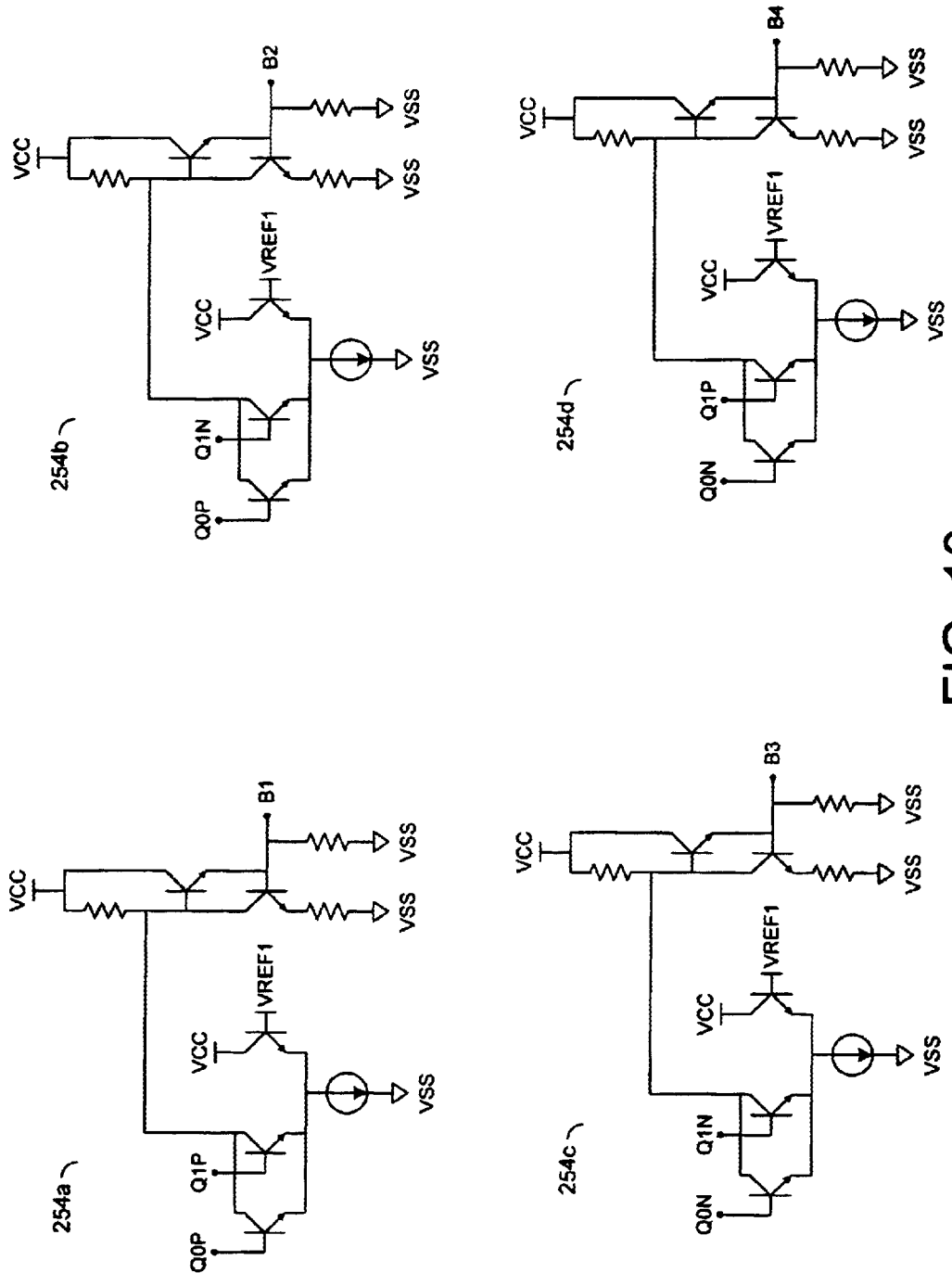
FIG. 10 is a more detailed diagram of the decoder circuits of FIG. 8.

Referring to FIG. 10, detailed diagrams of the decoders 254a–254d are shown. The circuit 254a may be configured to generate the current bias point B1. The circuit 254b may be configured to generate the current bias point B2. The circuit 254c may be configured to generate the current bias point B3. The circuit 254d may be configured to generate the current bias point B4.

The decoder circuits 254a–254d may be configured as NOR gates. The NOR gates 254a–254d may be implemented to ensure only a single particular bias B1–B4 may be on for each of the four combinations of the signals Q0 and Q1. For example, the current B1 of the circuit 254a may be enabled if the signals Q0 and Q1 are both LOW. If either of the signals Q0 or Q1 is HIGH, the reference current may be shunted away from the bias circuit 254a and the node B1 may sink down to ground. The circuits 254b–254d may be implemented similarly to the circuit 254a. The circuits 254a–254d may decode the low-level logic signals Q0N, Q0P, Q1N and Q1P to the four switched current source bias points (e.g., B1, B2, B3 and B4).

Figure 11:
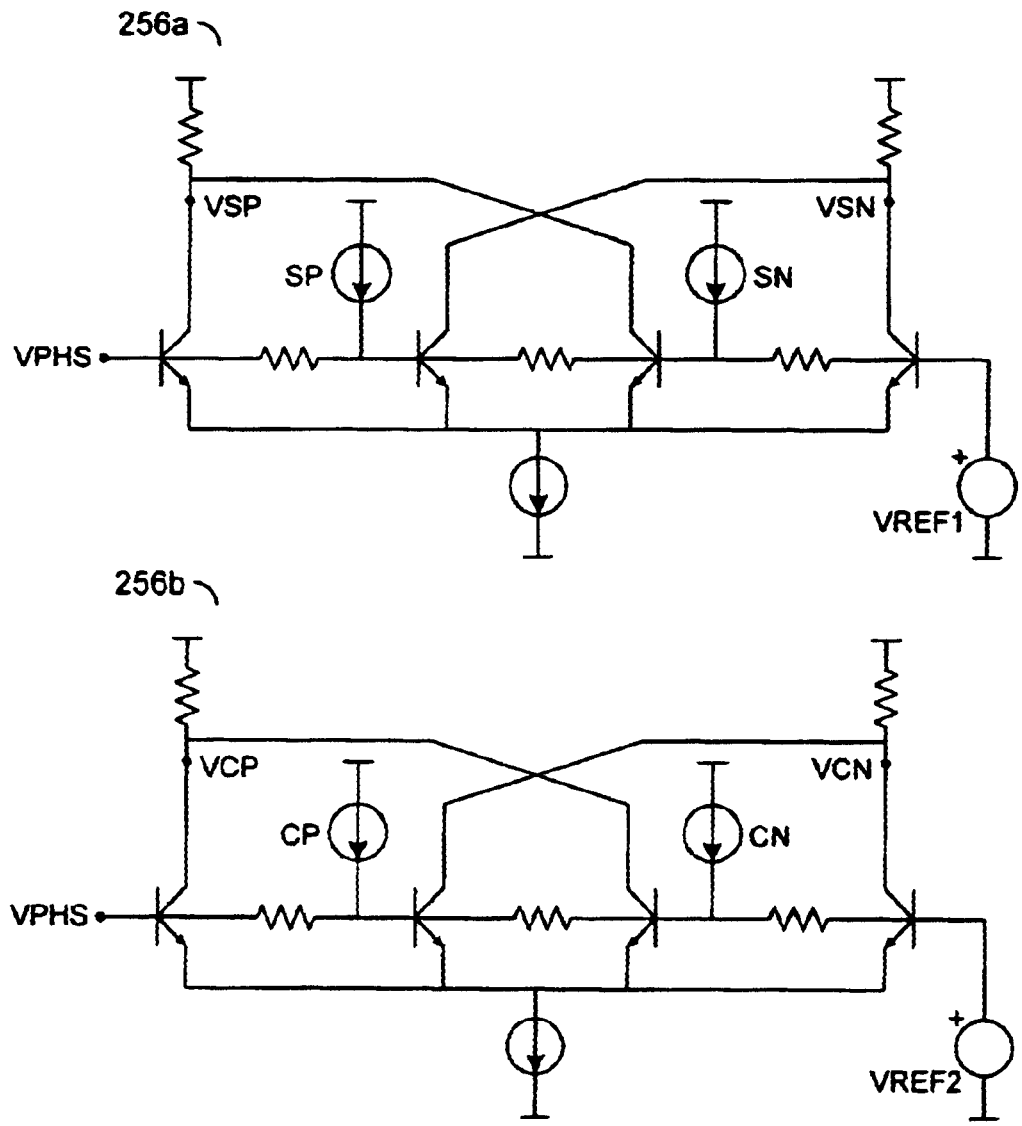
FIG. 11 is a more detailed diagram of the sine and cosine circuits of FIG. 8.

Referring to FIG. 11, detailed diagrams of the generation circuits 256a–256b are shown. The circuits 256a–256b may be implemented as differential current generators configured to generate the four voltages VSP, VSN, VCP and VCN. The variable phase control signal VPHS may control the generation of the voltage control signals VSP, VSN, VCP and VCN via current sources (e.g., CP, CN, SP and SN). The circuits 256a and 256b may be configured to generate the sinusoidally weighted differential voltages VSP, VSN, VCP and VCN in response to the phase control voltage VPHS and fixed reference voltages VREF1 and VREF2.

Figure 12:
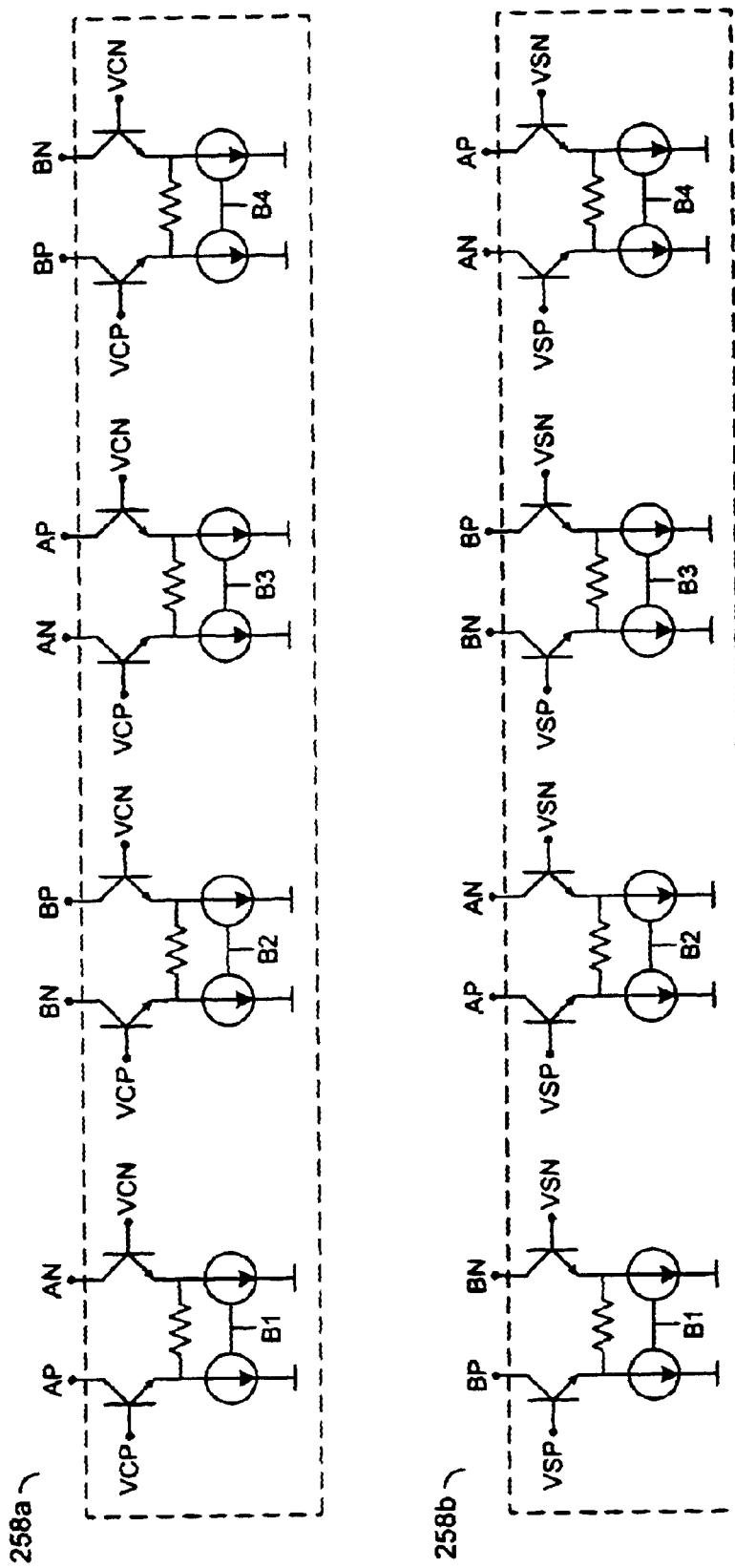
FIG. 12 is a more detailed diagram of the weighting circuits of FIG. 8.

Referring to FIG. 12, detailed diagrams of the weight circuits 258a–258b are shown. The circuits 258a–258b may be implemented as transform differential circuits. The circuits 258a–258b may be configured to transform the sinusoidally weighted differential voltages VSP, VSN, VCP and VCN to the sinusoidally weighted differential currents AP, AN, BP and BN. The transform differential circuits 258a–258b may be configured in response to the bias points B1–B4.

The circuit 100 may be implemented using combinations of active devices including, but not limited to, NPN or PNP, BJTs, N-or P-channel MOSFETs, MESFETs, JFETs and/or diodes. The present invention may be implemented with Gray decoding, however other appropriate type two-to-four line decodings are possible. For example, the present invention may implement signed binary or twos-complement decoding techniques. Alternatively, a switchable fixed phase shift may be implemented by replacing the externally variable control voltage VPHS with a fixed internally generated voltage.

While the invention has been particularly shown and described with reference to the preferred embodiments thereof, it will be understood by those skilled in the art that various changes in form and details may be made without departing from the spirit and scope of the invention.

What is claimed is:

1. An apparatus comprising:
   a quadrature network configured to generate a first and a second signal in response to an input signal;
   an RF combining circuit configured to generate an output signal comprising said input signal variably phase shifted from a selectable fixed phase starting point in response to (i) said first signal, (ii) said second signal and (iii) one or more weighted signals; and
   a weighting network configured to generate said weighted signals in response to a voltage control signal and one of four possible output selection signals, wherein said voltage control signal is configured to control said variable phase shift.

2. The apparatus according to claim 1, wherein said weighting network comprises:
   a logic circuit configured to generate said one of four possible selection output signals in response to one or more input selection signals; and
   a weight circuit configured to generate said weighted signals in response to said one of four possible output selections.

3. The apparatus according to claim 1, wherein said selectable fixed phase starting point is user selectable.

4. The apparatus according to claim 1, wherein said weighting network is further configured to control said selectable fixed phase starting point in response to said input selection signals.

5. The apparatus according to claim 1, wherein said RF combining circuit is further configured to multiply said first and second signals in response to said weighted signals.

6. The apparatus according to claim 5, wherein said RF combining circuit is further configured to sum said first and second signals to generate said output signal.

7. The apparatus according to claim 1, wherein said weighting network is configured to switch said weighted signals in response to a desired quadrant.

8. The apparatus according to claim 1, wherein said first signal is shifted in phase with respect to said second signal.

9. The apparatus according to claim 1, wherein said weighting network is further configured to scale said weighted signals in response to said voltage control signal.

10. The apparatus according to claim 1, wherein said weighting network comprises:
    a plurality of transistors configured to control respective amplitudes of said weighted signals; and
    a plurality of switches configured to control generation of said weighted signals.

11. The apparatus according to claim 1, wherein said weighting network comprises:
    one or more first converters configured to generate one or more first switch signals in response to one or more second switch signals;
    one or more decoders configured to generate one or more bias signals in response to said first switch signals;
    one or more generators configured to generate one or more current signals in response to said bias signals; and
    one or more weight circuits configured to generate said weighted signals in response to said current signals.

12. An apparatus comprising:
    a quadrature network configured to generate a first and a second signal in response to an input signal and one of four possible output selection signals;
    an RF combining circuit configured to generate an output signal comprising said input signal variably phase shifted from a selectable fixed phase starting point in response to (i) said first signal, (ii) said second signal and (iii) one or more weighted signals; and
    a weighting network configured to generate said weighted signals in response to a voltage control signal, wherein said voltage control signal is configured to control said variable phase shift.

13. A method for variably phase shifting an input signal comprising the steps of:
    (A) generating a first and a second signal in response to said input signal, said first signal shifted in phase with respect to said second signal;
    (B) generating one or more weighted signals in response to a voltage control signal and said one of four possible output selection signals;
    (C) controlling a selectable fixed phase starting point; and
    (D) generating an output signal, wherein said output signal comprises said input signal variably phase shifted from said selectable fixed phase starting point in response to said first signal, said second signal and said one or more weighted signals.

14. The method according to claim 13, wherein step (C) further comprises:
    selecting said selectable fixed phase starting point in response to a user desired phase shift.

15. The method according to claim 13, wherein step (C) further comprises:
    switching said weighted signals to control said selectable fixed phase starting point in response to one or more switch signals.

16. The method according to claim 13, wherein step (C) further comprises:
    switching said first and second signals to control said selectable fixed phase starting point in response to one or more switch signals.

17. The method according to claim 13, wherein step (D) further comprises:
    summing said first and second signals.

18. The method according to claim 13, wherein step (D) further comprises:
    multiplying said first and second signals in response to said weighted signals.

19. The method according to claim 13, wherein step (B) further comprises:
    scaling said weighted signals.

20. The method according to claim 13, wherein step (B) further comprises:
    controlling respective amplitudes of said weighted signals; and
    controlling generation of said weighted signals.

21. An apparatus comprising:
    a quadrature network configured to generate a first and a second signal in response to an input signal;
    an RF combining circuit configured to generate an output signal comprising said input signal variably phase shifted from a selectable fixed phase starting point in response to (i) said first signal, (ii) said second signal and (iii) one or more weighted signals; and
    a weighting network (i) comprising one or more weight circuits configured to generate said weighted signals in response to one or more current signals and (ii) configured to generate said weighted signals in response to a voltage control signal and one of four possible output selection signals, wherein said voltage control signal is configured to control said variable phase shift.

22. The apparatus according to claim 21, further comprising:
    one or more generators configured to generate said one or more current signals in response to one or more bias signals.

23. The apparatus according to claim 22, further comprising:
    one or more decoders configured to generate said one or more bias signals in response to one or more first switch signals.

* * * * *